United States Patent
Kirchoefer

(10) Patent No.: US 6,787,882 B2
(45) Date of Patent: Sep. 7, 2004

(54) SEMICONDUCTOR VARACTOR DIODE WITH DOPED HETEROJUNCTION

(75) Inventor: Steven Kirchoefer, Bowie, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/261,586

(22) Filed: Oct. 2, 2002

(65) Prior Publication Data

US 2004/0065943 A1 Apr. 8, 2004

(51) Int. Cl.[7] .............................................. H01L 29/93
(52) U.S. Cl. ....................... 257/596; 257/480; 257/595; 257/597; 257/598; 257/599; 257/600; 257/601; 257/602
(58) Field of Search .......................... 257/480, 595–602

(56) References Cited

U.S. PATENT DOCUMENTS

| | | | |
|---|---|---|---|
| 4,255,413 A | * | 3/1981 | Rattie et al. ................ 424/452 |
| 4,987,459 A | | 1/1991 | Kasahara |
| 5,220,194 A | * | 6/1993 | Golio et al. ................ 257/601 |
| 5,221,413 A | * | 6/1993 | Brasen et al. ............... 117/89 |
| 5,336,923 A | | 8/1994 | Geddes et al. |
| 5,392,306 A | | 2/1995 | Usami et al. |
| 5,747,865 A | | 5/1998 | Kim et al. |
| 5,789,801 A | * | 8/1998 | Stoneham ................... 257/597 |

* cited by examiner

Primary Examiner—Steven Loke
Assistant Examiner—Samuel A Gebremariam
(74) Attorney, Agent, or Firm—John J. Karasek; Stephen T. Hunnius

(57) ABSTRACT

A semiconductor device includes a plurality of barrier layers and a plurality of quantum well layers which are alternately interleaved with each other and disposed on a substrate of semiconductor material so as to form a multiple-heterojunction varactor diode. The barrier layers and quantum well layers are doped with impurities. The varactor diode includes an ohmic contact which is electrically connected to a heavily doped embedded region and a Schottky contact which is electrically connected to a depletion region of the diode. The ohmic contact and the Schottky contact enable an external voltage source to be applied to the contacts so as to provide a bias voltage to the varactor diode. A variable capacitance is produced as a result of the depletion region varying with a variation in the bias voltage. The varactor diode also provides a constant series resistance.

17 Claims, 1 Drawing Sheet

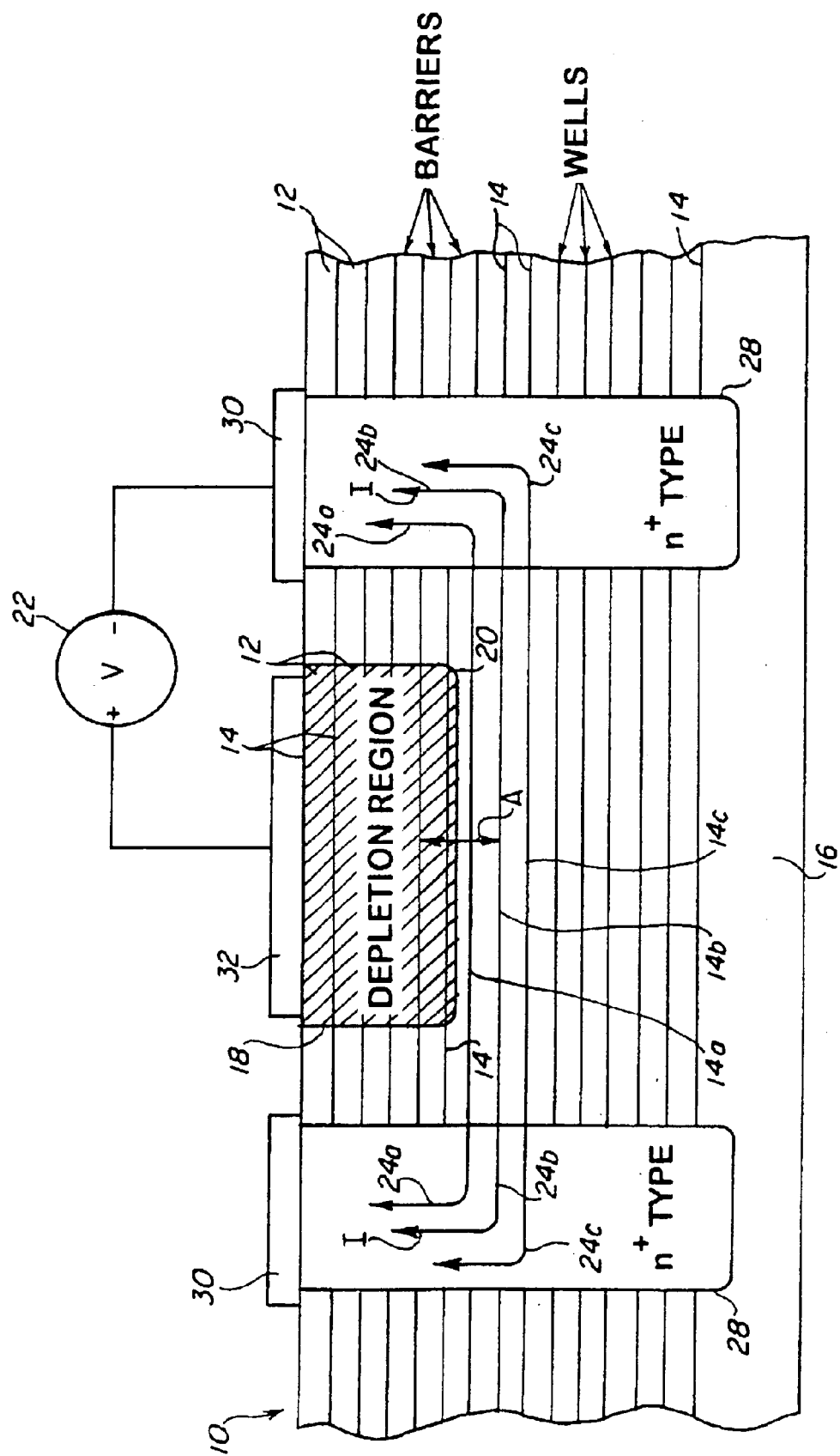

SEMICONDUCTOR VARACTOR DIODE WITH DOPED HETEROJUNCTION

FIELD OF THE INVENTION

The present invention relates to semiconductor devices and, more particularly, to semiconductor varactor diodes.

BACKGROUND OF THE INVENTION

Varactor diodes are semiconductor devices which are generally used in a variety of applications including, harmonic generators, frequency multipliers, oscillators and phase shifters. An important characteristic of the varactor diode is that the diode presents a capacitance which varies as a result of applying a variable bias voltage to a depletion region of the diode. Generally speaking, varactor diodes are known as variable-capacitance devices. The capacitance is typically modeled as a parallel-plate capacitance with the depletion region serving as a dielectric. The depletion region varies with a corresponding change in voltage applied to the varactor diode, thereby changing the distance between the parallel plates and resulting in variable capacitance. Conventional varactor diodes include P-N junction diodes and Schottky diodes which include layers that are doped with impurities in order to achieve a desired variable capacitance. Although the use of graded doping provides some degree of freedom in achieving desirable capacitance characteristics, the range of variable capacitance is limited and in certain applications insufficient due to the design and structural limitations of the device.

Conventional varactor diodes further include a parasitic series resistance which is a direct consequence of current flowing through undepleted regions of the diode.

A voltage drop is generated as a result of current flowing through the parasitic resistance of the varactor diode, thus requiring an increase in external voltage to compensate for the voltage drop. In an effort to reduce the parasitic series resistance of the varactor diode and to provide some degree of control over the voltage dependent capacitance, custom doping profiles are often used to modify the characteristics of the varactor diode.

One prior art varactor diode is disclosed in U.S. Pat. No. 5,336,923 to Geddes et al. The Geddes et al. patent discloses a varactor diode having a stepped-capacitance, voltage profile. The varactor diode includes doped and undoped layers which are formed on a semiconductor substrate. The diode further includes a Schottky contact and an ohmic contact which are disposed on a selected undoped layer for enabling an external voltage to be applied to the device. The characteristics of the varactor diode are modified by selecting specific layer thicknesses and providing higher doping concentrations. Although higher doping concentrations effectively reduce the series resistance of the diode, providing higher doping concentrations also requires that a higher external voltage be applied in order to produce a variable capacitance.

Another prior art varactor diode is disclosed in U.S. Pat. No. 5,747,865 to Kim et al. The Kim et al. patent discloses a varactor diode having a surface layout area and a depletion layer area. The capacitance characteristic of the varactor diode is modified by varying the depletion layer area as a result of varying the surface layout area. A desired capacitance is achieved through a layout contour of the surface area by using specific mask patterns in a multi-etching process, selective epi-layer growing process or ion implantation process.

A further prior art variable capacitance diode is disclosed in U.S. Pat. No. 4,987,459 to Kasahara. The Kasahara patent discloses a variable capacitance diode comprising an epitaxial layer of a first conductivity type disposed on a semiconductor substrate, a diffusion layer of a first conductivity type formed in the epitaxial layer, and a diffusion layer of a second conductivity type formed in the diffusion layer of a first conductivity type. The diode also includes a buried layer. A PN junction is formed between the diffusion layers and the epitaxial layer and electrodes are provided at the top and bottom of the diode structure for receiving an external voltage. The range of variable capacitance of the diode is increased as a result of custom doping the epitaxial layer and diffusion layers with different impurity concentrations.

SUMMARY OF THE INVENTION

In accordance with the invention, an improved varactor diode is provided which affords important advantages over prior art varactor diode devices. The varactor diode includes doped heterojunction layers which offer additional degrees of freedom in design, resulting in a greater ability to modify the characteristics of the varactor diode so as to provide a desired variable capacitance and a constant series resistance.

According to the present invention, there is provided a varactor diode comprising: a substrate of semiconducting material; a plurality of barrier layers and a plurality of quantum-well layers alternately interleaved with each other and disposed on said substrate so as to form a multiple quantum-well heterostructure; a depletion region formed in said multiple quantum-well heterostructure; an embedded region formed in said multiple quantum-well heterostructure so as to be electrically connected to each of said barrier layers and each of said quantum-well layers; and a substrate contact electrically connected to said embedded region and a region contact electrically connected to said depletion region for enabling an external voltage to be applied between said substrate contact and said region contact so as to cause a variation in said depletion region as a result of a variation in the external voltage.

Preferably, the substrate is heavily doped with an n-type impurity, the plurality of barrier layers include an alloy of a first composition and the plurality of quantum well layers include an alloy of a second composition.

Advantageously, the depletion region comprises a predetermined number of said plurality of barrier layers and a predetermined number of said plurality of quantum-well layers.

Advantageously, the depletion region further comprises a depletion edge extending parallel to said substrate and disposed adjacent to one of said plurality of quantum-well layers, said depletion edge moving parallel to said substrate and adjacent to a different one of said plurality of quantum-well layers as a result of a variation in said external voltage.

Preferably, each of the predetermined number of barrier layers is doped with an n-type impurity concentration of $1 \times 10^{16}$ cm$^{-3}$, and each of the predetermined number of quantum-well layers is doped with an n-type impurity concentration of at least $1 \times 10^{18}$ cm$^{-3}$.

Preferably, the average doping density for the barriers and wells together is set at a value such as to result in a Debye length (charge screening length) that is larger by a factor of at least 2 as compared with the sum of a single well and a single barrier thickness. An important advantage of this features is that it results in a smooth capacitance variation with bias, rather than a stepped variation, because the sharpness of the depletion front is less abrupt than the periodicity of the well and barrier structure.

Preferably, the embedded region is heavily doped with an n-type impurity.

Advantageously, the substrate contact comprises an annular metal ring and the region contact comprises a Schottky metal layer.

Preferably, the substrate contact comprises germanium-nickel-gold and the region contact comprises titanium-platinum-gold.

Advantageously, the substrate contact and the region contact are patterned into interdigitated fingers so as to minimize series resistance.

In accordance with a further aspect of the invention, there is provided a varactor diode comprising: a substrate of semiconducting material; a plurality of barrier layers and a plurality of undepleted quantum-well layers providing a primary conductive path, said barrier layers and said undepleted quantum-well layers being alternately interleaved with each other and being formed on said substrate; a depletion region including a depletion front disposed adjacent to, and extending parallel to, said primary conductive path; a doped region operatively connected to each of said barrier layers and to each of said undepleted quantum-well layers; and a substrate contact electrically connected to said doped region and a region contact electrically connected to said depletion region for enabling an external bias to be applied so as to cause a variation in said depletion front thereby providing a constant series resistance in said primary conductive path.

In accordance another aspect of the invention, there is provided a variable capacitance diode comprising: a substrate of semiconducting material; a plurality of barrier layers and a plurality of undepleted quantum-well layers alternately interleaved with each other and formed on said substrate; a depletion region including a depletion front, a predetermined number of said plurality of barrier layers and a plurality of depleted quantum-well layers; a primary conductive path formed of said undepleted quantum-well layers, said primary conductive path disposed adjacent to and extending parallel to said depletion front; a heavily-doped region formed within said substrate so as to be electrically connected to each of said barrier layers and to each of said undepleted quantum-well layers; and a substrate contact electrically connected to said heavily-doped region and a region contact electrically connected to said depletion region for enabling an external voltage to be applied so as to cause a variation in said depletion front thereby providing a constant series resistance in said primary conductive path.

Further features and advantages of the present invention will be set forth in, or apparent from, the detailed description of preferred embodiments thereof which follows.

BRIEF DESCRIPTION OF THE DRAWINGS

The single FIGURE in the drawing is a cross sectional view of the semiconductor varactor diode in accordance with a preferred embodiment of the present invention.

DETAILED DESCRIPTION OF THE PREFERRED EMBODIMENTS

Referring to the single FIGURE of the drawings, there is shown a multi-heterojunction semiconductor varactor diode. The varactor diode, which is generally denoted 10, comprises a plurality of barrier layers 12 and a plurality of quantum well layers 14. The quantum well layers 14 are used to provide sequential conduction paths, in the plane of the layers, to the moving depletion front. This results in a constant series resistance independent of depletion position.

The barrier layers 12 and the quantum well layers 14 are alternately interleaved with each other as illustrated and disposed on a substrate 16. The substrate 16 is heavily doped with n-type concentration so as to provide additional contact area to reduce the overall series resistance. Although substrate 16 is preferably formed from a GaAs semiconductor material, the substrate 16 can be formed from any material which will support single crystal epitaxial growth for the overlying heterostructure design.

As indicated above, the varactor diode 10 is fabricated on the substrate 16 of semiconducting material containing a layered structure of differing alloys so as to form the multiple quantum well heterostructure described previously. The heterojunction design offers additional degrees of freedom in designing the varactor diode 10 which results in a greater ability to tailor the capacitance of varactor diode 10 as well as to reduce the series resistance thereof. For purposes of example only, the alloys of the layered structure can be selected from either Groups III–V or II–VI. The plurality of barrier layers 12 includes alloys of the same composition and the plurality of the quantum well layers 14 also includes alloys of the same composition. However, the semiconductor alloy selected for the barrier layers 12 is different from the semiconductor alloy selected for the quantum well layers 14.

The barrier layers 12 and the quantum well layers 14 are grown epitaxially on the substrate 16. It will be appreciated that although crystal epitaxial growth is the preferred means by which the barrier layers 12 and the well layers 14 are fabricated on the substrate 16, other semiconductor growth technologies can be used, such as atomic layer epitaxy and metal organic chemical vapor deposition.

The varactor diode 10 includes a depletion region 18 which moves as a result of a bias voltage applied to the varactor diode 10. The movement of the depletion region 18 produces variable capacitance. The movement of the depletion region 18 is shown as (A) in the single FIGURE. The depletion region 18 includes a predetermined number of barrier layers 12 and a predetermined number of quantum well layers 14. Each of the predetermined number of barrier layers 12 is doped with an n-type impurity and has a preferred impurity concentration of $1 \times 10^{16}$ cm$^{-3}$ Each of the predetermined number of quantum well layers 14 is doped with an n-type impurity and has a preferred impurity concentration of at least $1 \times 10^{18}$ cm$^{-3}$ In the preferred embodiment of the invention, the dopant is Si. The quantum well layers 14 have high carrier densities in which carriers originate either from direct doping of the alloys comprising the quantum well layers 14 or by doping of the surrounding barrier material which supplies the carriers to the quantum wells. It will be appreciated that although specific doping impurities and concentrations have been described above, other doping types and concentrations may be selected in order to achieve the desired variable capacitance characteristics of the varactor diode 10.

The depletion region 18 further includes a depletion edge or front 20 which extends parallel to the substrate 16 and is situated adjacent to one of the plurality of quantum well layers 14. The depletion front 20 moves parallel to the substrate 16 and adjacent to a quantum well layer 14 as a result of a variation in the bias voltage which is supplied by an external voltage source 22. A primary conduction path, as indicated at 24a, from the depletion front 20 is provided through the undepleted quantum well layer, as indicated at 14a, which is nearest to the depletion front 20. Additional paths 24b and 24c (through respective barrier layers 14b and 14c) are created as the depletion region 18 moves. These paths are collectively referred to as path 24.

Electrical current I passes through the primary conductive paths 24 and, as illustrated, the latter extend parallel to the depletion front 20 until reaching a heavily doped embedded region 28. As a result of the movement of the depletion region 18, the quantum well layers 14 which form the primary conduction path 24 provide a constant series resistance.

To achieve an optimal profile for depletion region 18, doping should be sufficiently low enough so as to provide for adequate depletion movement as a result of the bias voltage applied to the varactor diode 10. In addition, the carrier concentration in the quantum well layers 14 must be high enough to provide a good conduction path 24 for current I. To meet the objective of providing a high carrier concentration, the quantum well layers 14 are thin, typically under 10 nm. The barrier layers 12 are thick, with a thickness generally ten to twenty times that of the quantum well layers 14. The depth and width of the quantum well layers 14 are chosen to provide sufficiently-deep quantum wells for high carrier confinement.

Doping is typically concentrated in the barrier layers 12 in order to keep the mobility of carriers as high as possible in the quantum well layers 14. The exact doping types and concentrations are dependent on the thickness of the barrier layers 12 and the quantum well layers 14 selected. It will be appreciated that there is no distinction between the thickness of the barrier layers 12 and quantum well layers 14 in the depleted region 18 and the undepleted region outside of region 18. The thickness, depth and widths of the barrier layers 12 and quantum well layers 14 are determined in part by the capacitance changes desired and the semiconductor materials used.

The varactor diode 10 includes an ohmic or substrate contact 30 and a region or Schottky contact 32 which are individually disposed on a barrier layer 12. The substrate contact 30 is formed from an annular metal ring which is electrically connected to the embedded region 28. The Schottky contact 32 is electrically connected to the depletion region 18. The ohmic contact 30 and the Schottky contact 32 are electrically connected to the external voltage source 22 for enabling a bias voltage to be applied to the varactor diode 10 so as to cause a variation in the depletion region 18 as a result of a variation in the bias voltage. In a nonlimiting example, the ohmic contact 30 is constructed from germanium-nickel-gold and the Schottky contact 32 is constructed from titanium-platinum-gold. Although the contact metals selected provide optimal performance in GaAs devices, it will be appreciated that different materials can be used for the ohmic contact 30 and the Schottky contact 32 depending on the semiconductor alloys chosen for the barrier layers 12 and well layers 14.

The series resistance of the varactor diode 10 depends largely on the distance in which the carriers must pass laterally along the barrier layers 12 and quantum well layers 14. The substrate contact 30 and the Schottky contact 32 are preferably patterned into interdigitated or combed fingers (not shown) so as to reduce the distance in which the carriers pass thereby minimizing series resistance.

The embedded region 28 mentioned above is heavily doped with an n-type impurity. The embedded region 28 can be produced by either ion implantation or diffusion of an appropriate dopant. The embedded region 28 passes through all of the barrier layers 12 and quantum well layers 14 resulting in the embedded region 28 being electrically connected to each individual barrier layer 12 and quantum well layer 14.

Although this operation should be evident from the foregoing, briefly summarizing the overall operation of the varactor diode 10, the external voltage source 22 produces a bias voltage which is applied to depletion region 18 via Schottky contact 32, and ohmic contact 30. The depletion region 18 moves or varies as a result of a variation in the bias voltage applied to the varactor diode 10. The variation of the depletion region 18 produces a variable capacitance. The electrical current I passes from the depletion region 18 through the depletion front 20 to primary conduction path 24 so as to reach the heavily doped embedded region 28. Since the quantum well layers 14 form the conductive path 24, the varactor diode 10 exhibits a constant series resistance.

Although the invention has been described above in relation to preferred embodiments thereof, it will be understood by those skilled in the art that variations and modifications can be effected in these preferred embodiments without departing from the scope and spirit of the invention.

What is claimed is:

1. A varactor diode comprising:
    a substrate of semiconducting material;
    a plurality of barrier layers and a plurality of quantum-well layers alternately interleaved with each other and disposed on said substrate so as to form a multiple quantum-well heterostructure;
    a depletion region formed in said multiple quantum-well heterostructure, wherein said depletion region comprises a predetermined number of said plurality of barrier layers and a predetermined number of said plurality of quantum-well layers, wherein each of said predetermined number of barrier layers is doped with an n-type impurity concentration of $1 \times 10^{16}$ cm$^{-3}$, and wherein each of said predetermined number of quantum-well layers is doped with an n-type impurity concentration of at least $1 \times 10^{18}$ cm$^{-3}$;
    an embedded region formed in said multiple quantum-well heterostructure so as to be electrically connected to each of said barrier layers and each of said quantum-well layers; and
    a substrate contact electrically connected to said embedded region and a region contact electrically connected to said depletion region for enabling an external voltage to be applied between said substrate contact and said region contact so as to cause a variation in said depletion region as a result of a variation in the external voltage.

2. A varactor diode according to claim 1, wherein said substrate is heavily doped with an n-type impurity.

3. A varactor diode according to claim 1, wherein said plurality of barrier layers include an alloy of a first composition.

4. A varactor diode according to claim 1, wherein said plurality of quantum well layers include an alloy of a second composition.

5. A varactor diode according to claim 1, wherein said depletion region further comprises a depletion edge extending parallel to said substrate and disposed adjacent to one of said plurality of quantum-well layers, said depletion edge moving parallel to said substrate and adjacent to a different one of said plurality of quantum-well layers as a result of a variation in said external voltage.

6. A varactor diode according to claim 1, wherein said embedded region is heavily doped with an n-type impurity.

7. A varactor diode according to claim 1, wherein said substrate contact comprises an annular metal ring.

8. A varactor diode according to claim 7, wherein said substrate contact comprises germanium-nickel-gold.

9. A varactor diode according to claim 1, wherein said region contact comprises a Schottky metal layer.

10. A varactor diode according to claim 7, wherein said region contact comprises titanium-platinum-gold.

11. A varactor diode according to claim 1, wherein said substrate contact and said region contact are patterned into interdigitated fingers so as to minimize series resistance.

12. A varactor diode comprising:

a substrate of semiconducting material;

a plurality of barrier layers and a plurality of quantum-well layers alternately interleaved with each other and disposed on said substrate so as to form a multiple quantum-well heterostructure, wherein the barrier layers and quantum-well layers together have an average doping density of a value resulting in a charge screening length which is larger by a factor of at least two than the sum of a single barrier layer thickness and a single quantum-well layer thickness;

a depletion region formed in said multiple quantum-well heterostructure;

an embedded region formed in said multiple quantum-well heterostructure so as to be electrically connected to each of said barrier layers and each of said quantum-well layers; and a substrate contact electrically connected to said embedded region and a region contact electrically connected to said depletion region for enabling an external voltage to be applied between said substrate contact and said region contact so as to cause a variation in said depletion region as a result of a variation in the external voltage.

13. A varactor diode comprising:

a substrate of semiconducting material;

a plurality of barrier layers and a plurality of undepleted quantum-well layers providing a primary conductive path, said barrier layers and said undepleted quantum-well layers being alternately interleaved with each other and being formed on said substrate;

a depletion region including a depletion front disposed adjacent to, and extending parallel to, said primary conductive path, wherein said depletion region comprises a predetermined number of said plurality of barrier layers and a predetermined number of said plurality of quantum-well layers, wherein each of said predetermined number of barrier layers is doped with an n-type impurity concentration of $1 \times 10^{16}$ cm$^{-3}$, and wherein each of said predetermined number of quantum-well layers is doped with an n-type impurity concentration of at least $1 \times 10^{18}$ cm$^{-3}$;

a doped region operatively connected to each of said barrier layers and to each of said undepleted quantum-well layers; and a substrate contact electrically connected to said doped region and a region contact electrically connected to said depletion region for enabling an external bias to be applied so as to cause a variation in said depletion front thereby providing a constant series resistance in said primary conductive path.

14. A varactor diode according to claim 13, wherein said depletion region further comprises a depletion edge extending parallel to said substrate and disposed adjacent to one of said plurality of quantum-well layers, said depletion edge moving parallel to said substrate and adjacent to a different one of said plurality of quantum-well layers as a result of variation in said external voltage.

15. A variable capacitance diode comprising:

a substrate of semiconducting material;

a plurality of barrier layers and a plurality of undepleted quantum-well layers alternately interleaved with each other and formed on said substrate, wherein each of said barrier layers is doped with an n-type impurity concentration of $1 \times 10^{16}$ cm$^{-3}$, and wherein each of said predetermined number of quantum-well layers is doped with an n-type impurity concentration of at least $1 \times 10^{18}$ cm$^{-3}$;

a depletion region including a depletion front, a predetermined number of said plurality of barrier layers and a plurality of depleted quantum-well layers;

a primary conductive path formed of said undepleted quantum-well layers, said primary conductive path disposed adjacent to and extending parallel to said depletion front;

a heavily-doped region formed within said substrate so as to be electrically connected to each of said barrier layers and to each of said undepleted quantum-well layers; and a substrate contact electrically connected to said heavily-doped region and a region contact electrically connected to said depletion region for enabling an external voltage to be applied so as to cause a variation in said depletion front thereby providing a constant series resistance in said primary conductive path.

16. A varactor diode comprising:

a substrate of semiconducting material;

a plurality of barrier layers and a plurality of quantum-well layers alternately interleaved with each other and disposed on said substrate so as to form a multiple quantum-well heterostructure, wherein said plurality of barrier layers include an alloy of a first composition and wherein said plurality of quantum well layers include an alloy of a second composition;

a depletion region formed in said multiple quantum-well heterostructure, wherein said depletion region comprises a predetermined number of said plurality of barrier layers and a predetermined number of said plurality of quantum-well layers, wherein each of said predetermined number of barrier layers is doped with an n-type impurity concentration of $1 \times 10^{16}$ cm$^{-3}$, and wherein each of said predetermined number of quantum-well layers is doped with an n-type impurity concentration of at least $1 \times 10^{18}$ cm$^{-3}$;

an embedded region formed in said multiple quantum-well heterostructure so as to be electrically connected to each of said barrier layers and each of said quantum-well layers; and a substrate contact electrically connected to said embedded region and a region contact electrically connected to said depletion region for enabling an external voltage to be applied between said substrate contact and said region contact so as to cause a variation in said depletion region as a result of a variation in the external voltage.

17. A varactor diode comprising:

a substrate of semiconducting material, wherein said substrate is heavily doped with an n-type impurity;

a plurality of barrier layers and a plurality of quantum-well layers alternately interleaved with each other and disposed on said substrate so as to form a multiple quantum-well heterostructure;

a depletion region formed in said multiple quantum-well heterostructure, wherein said depletion region comprises a predetermined number of said plurality of barrier layers and a predetermined number of said plurality of quantum-well layers, wherein each of said predetermined number of barrier layers is doped with an n-type impurity concentration of $1 \times 10^{16}$ cm$^{-3}$, and wherein each of said predetermined number of quantum-well layers is doped with an n-type impurity concentration of at least $1 \times 10^{18}$ cm$^{-3}$, wherein said depletion region further comprises a depletion edge extending parallel to said substrate and disposed adjacent to one of said plurality of quantum-well layers, said depletion edge moving parallel to said substrate and adjacent to a different one of said plurality of quantum-well layers as a result of a variation in said external voltage;

an embedded region formed in said multiple quantum-well heterostructure so as to be electrically connected to each of said barrier layers and each of said quantum-well layers; and a substrate contact electrically connected to said embedded region and a region contact electrically connected to said depletion region for enabling an external voltage to be applied between said substrate contact and said region contact so as to cause a variation in said depletion region as a result of a variation in the external voltage, wherein said substrate contact comprises an annular germanium-nickel-gold ring.

* * * * *